United States Patent [19]
Camenforte et al.

[11] Patent Number: 6,103,550
[45] Date of Patent: Aug. 15, 2000

[54] MOLDED TAPE SUPPORT FOR A MOLDED CIRCUIT PACKAGE PRIOR TO DICING

[75] Inventors: Raymundo M. Camenforte; John Briar, both of Singapore, Singapore

[73] Assignee: ST Assembly Test Services, Pte Ltd., Singapore, Singapore

[21] Appl. No.: 09/161,408

[22] Filed: Sep. 28, 1998

[51] Int. Cl.$^7$ ................................................ H01L 21/58
[52] U.S. Cl. ........................ 438/107; 438/111; 438/125
[58] Field of Search ................................. 438/107, 111, 438/125

[56] References Cited

U.S. PATENT DOCUMENTS

| | | | |
|---|---|---|---|
| 4,680,617 | 7/1987 | Ross | 357/72 |
| 4,872,825 | 10/1989 | Ross | 425/117 |
| 5,299,091 | 3/1994 | Hoshi et al. | 361/723 |
| 5,656,549 | 8/1997 | Woosley et al. | 438/118 |
| 5,744,084 | 4/1998 | Chia et al. | 264/276 |

*Primary Examiner*—David E. Graybill
*Attorney, Agent, or Firm*—George O. Saile; Stephen B. Ackerman; Larry J. Prescott

[57] ABSTRACT

A molded electronic circuit package is described to which stabilizing tape can be attached using automatic or semi-automatic means. The stabilizing tape stabilizes the assembly for further processing operations such as dicing or attachment to a higher level package. The assembly comprises a substrate to which devices are attached. Molded caps are formed over the devices. Molded tape supports are formed at the same time as the molded caps and are located adjacent to opposite sides of the molded cap. The molded tape supports have the same height as the molded cap. The stabilizing tape can then be attached to the tops of the molded tape supports and the molded caps using automatic or semi-automatic means.

18 Claims, 4 Drawing Sheets

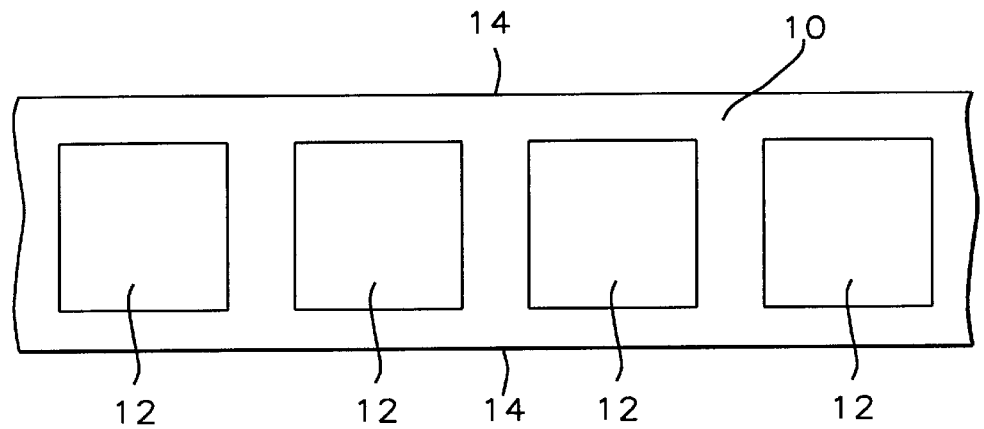
FIG. 1 – Prior Art
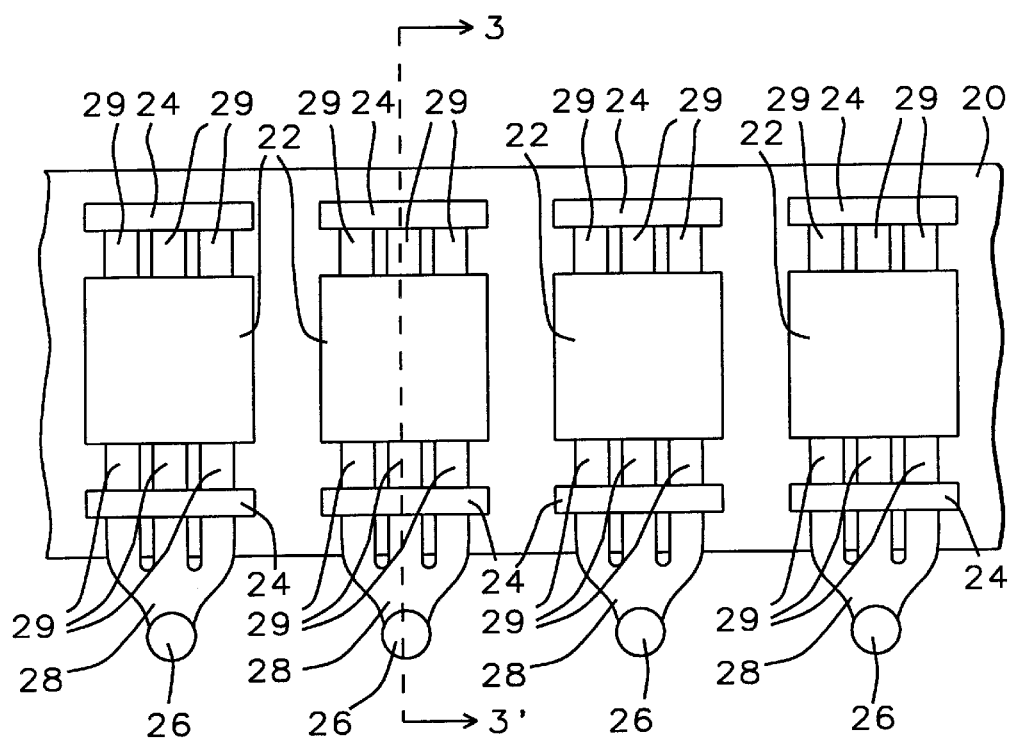
FIG. 2

MOLDED TAPE SUPPORT FOR A MOLDED CIRCUIT PACKAGE PRIOR TO DICING

BACKGROUND OF THE INVENTION (1) Field of the Invention

This invention relates to forming molded tape supports adjacent to molded caps in an electronic circuit package. The molded tape supports have the same height as the molded caps and stabilizing tape is attached to the molded tape supports and molded caps.

(2) Description of the Related Art

U.S. Pat. No. 4,872,825 to Ross describes an encapsulation method and apparatus for encapsulating electronic circuit devices. The method uses stacks of resin impregnated fibrous layers.

U.S. Pat. No. 4,680,617 to Ross also describes an encapsulation method and apparatus for encapsulating electronic circuit devices. This method also uses stacks of resin impregnated fibrous layers.

U.S. Pat. No. 5,299,091 to Hoshi et al. describes a packaged semiconductor device. The semiconductor device uses electrode pads. The package uses molded packages and lead frames.

U.S. Pat. No. 5,744,084 to Chia et al. describes a method of improving the molding operation for an overmolded package.

U.S. Pat. No. 5,656,549 to Woosley et al. describes a method of packaging a semiconductor device using a mold and molding compound.

SUMMARY OF THE INVENTION

Molded encapsulation is frequently used in packaging electronic circuit devices. Frequently substrates having a number of devices attached are encapsulated by forming molded caps over the electronic circuit devices. As shown in FIG. 1, a number of devices are often attached to a substrate 10 and a number of molded caps 12 are then formed over the devices. This assembly is then diced, or cut, into pieces, each of the pieces having one or two molded caps.

In the handling and dicing operations it is often necessary to put tape at the side rails 14 of the substrate 10 to aid in the dicing operation. This tape attachment is a manual operation and is slow and costly.

It is a principle objective of this invention to provided a molded electronic package which allows tape required for dicing operations to be applied using low cost automated means.

It is another principle objective of this invention to provide a method of forming a molded electronic package which allows tape required for dicing operations to be applied using low cost automated means.

It is another principle objective of this invention to provide a method of supporting a molded electronic package during dicing operations.

These objectives are achieved by forming a molded tape support on the substrate adjacent to the molded cap. There are two molded tape supports for each molded cap which are located adjacent to opposite sides of the molded cap. The height of the tape supports is the same as the height of the molded cap and single sided tape, used to support the assembly during dicing, is attached to the tops of the molded tape supports and the tops of the molded caps. The tape supports are formed at the same time the molded caps are formed, formed in the same mold, and formed using the same material. The single sided tape can be attached to the tops of the molded tape supports and the tops of the molded caps using automated or semi-automated means thereby reducing cost and increasing throughput.

BRIEF DESCRIPTION OF THE DRAWINGS

FIG. 1 shows a top view of a prior art circuit package showing a substrate with molded caps.

FIG. 2 shows a top view of the circuit package of this invention showing a substrate having molded caps and molded tape supports formed thereon before the mold runner gates have been removed.

DESCRIPTION OF THE PREFERRED EMBODIMENTS

Figure 3:
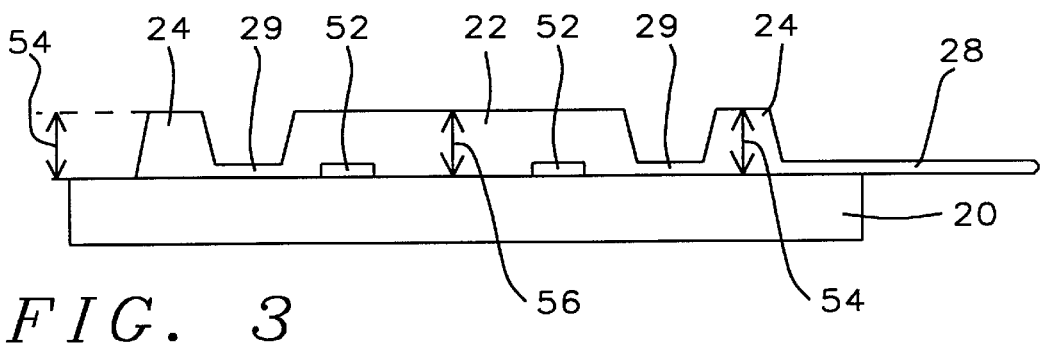
FIG. 3 shows a cross section view of the circuit package of FIG. 2 taken along line 3—3' of FIG. 2.

Refer now to FIGS. 2–5 for a description of the preferred embodiment of the circuit package of this invention. FIG. 2 shows a top view of the circuit package of this invention after being removed from the mold. Molded caps 22 are formed on the first surface of a substrate 20. The molded caps 22 cover devices, not shown in FIG. 2, attached to the substrate 20. Molded tape supports 24 are also formed on opposite sides of the molded caps 22 and have the same height as the molded caps. The molded caps 22 and molded tape supports 24 are formed of a material such as a conventional epoxy based molding compound. The substrate 20 is formed of a material such as BT (Bismaleimide Triazene) laminate. FIG. 2 shows the outboard mold runner gates 28 still attached to some of the molded tape supports and the cull remain or residue 26 of the mold material. FIG. 2 also shows the inboard mold runner gate 29 attached to the molded tape supports 24 and the molded caps 22.

FIG. 3 shows a cross section view of the circuit package of this invention shown in FIG. 2 taken along line 3–3' of FIG. 2. FIG. 3 shows devices 52, such as integrated circuit elements or other electronic devices, attached to the substrate 20 and covered by the molded cap 22. FIG. 3 shows that the outboard mold runner gate 28 has not yet been broken away. As shown in FIG. 3, the molded tape supports 24 have the same height 54 as the height 56 of the molded caps 22 which makes it easy to attach stabilizing tape to the tops of the molded tape supports 24 and molded caps 22 using automatic or semi-automatic means.

Figure 4:
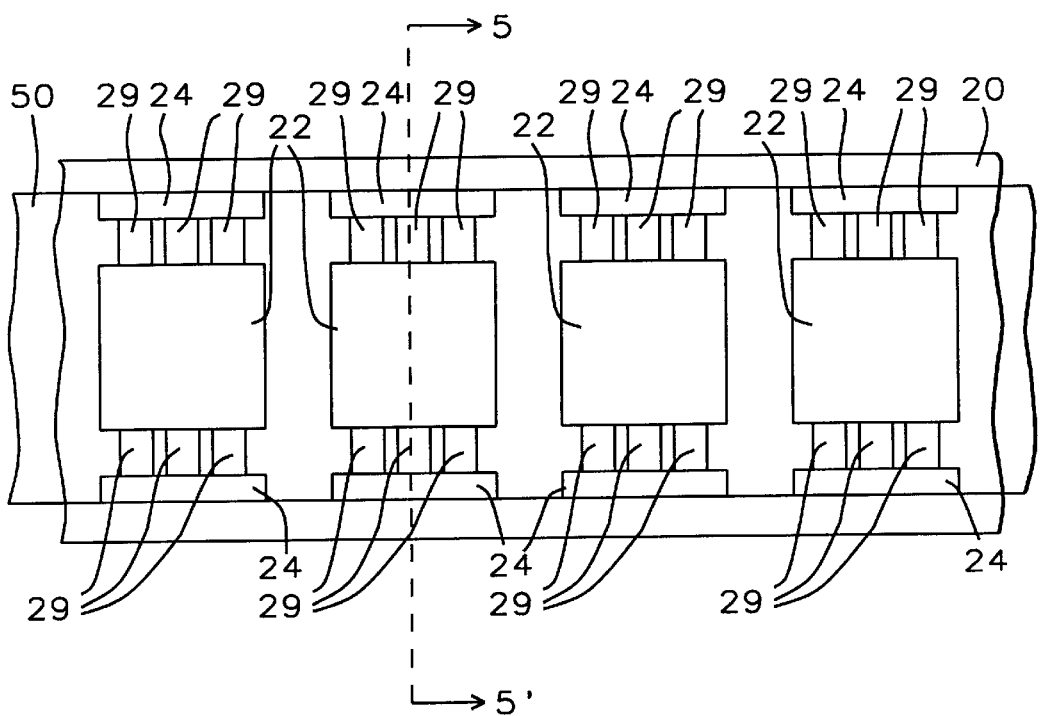
FIG. 4 shows a top view of the circuit package of this invention showing a substrate having molded caps and molded tape supports formed thereon after the mold runner gates have been removed and tape has been attached to the tops of the molded caps and molded tape supports.

FIG. 4 shows the top view of the circuit package after the outboard mold runner gates and the cull remain or residue of the mold material have been removed and a stabilizing tape 50 has been attached to the tops of the molded tape supports 24 and the molded caps 22. The stabilizing tape 50 can be single sided tape formed of materials such as a polyolefin backing with acrylic based adhesive. The inboard mold runner gates 29 are shown attached to the substrate 20, the molded tape supports 24, and the molded caps 22.

Figure 5:
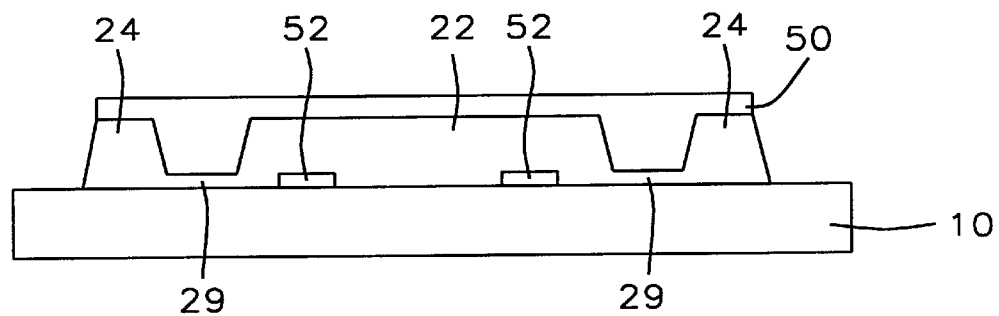
FIG. 5 shows a cross section view of the circuit package of FIG. 4 taken along line 5—5' of FIG. 4.

FIG. 5 shows a cross section view, taken along line 5–5' of FIG. 4, of the circuit package after the stabilizing tape 50 has been attached to the molded tape supports 24 and the molded caps 22. The molded tape supports 24 and the molded caps 22 having the same height makes is easy to attach the stabilizing tape 50 to the tops of the molded tape supports 24 and the molded caps 22 and allows the stabilizing tape 50 to be attached using automatic or semi-automatic means.

Figure 6A:
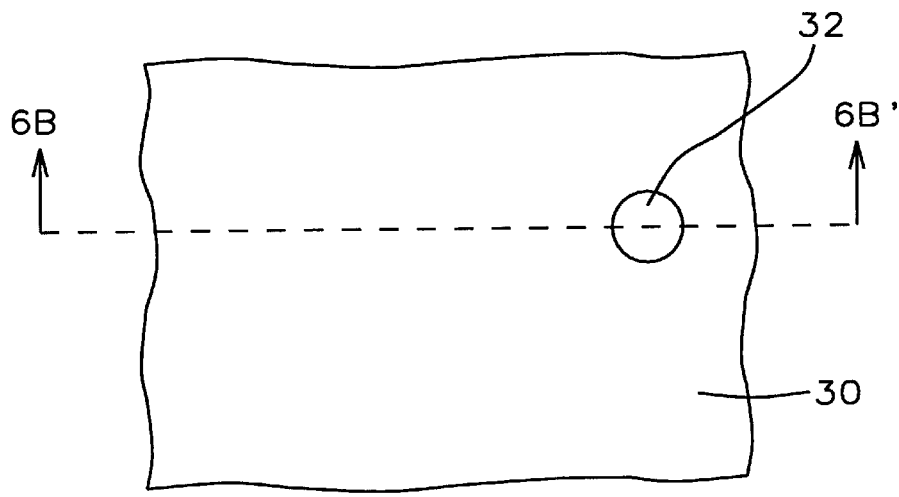
FIG. 6A shows a schematic top view of the mold used to form the circuit package of this invention.
Figure 6B:
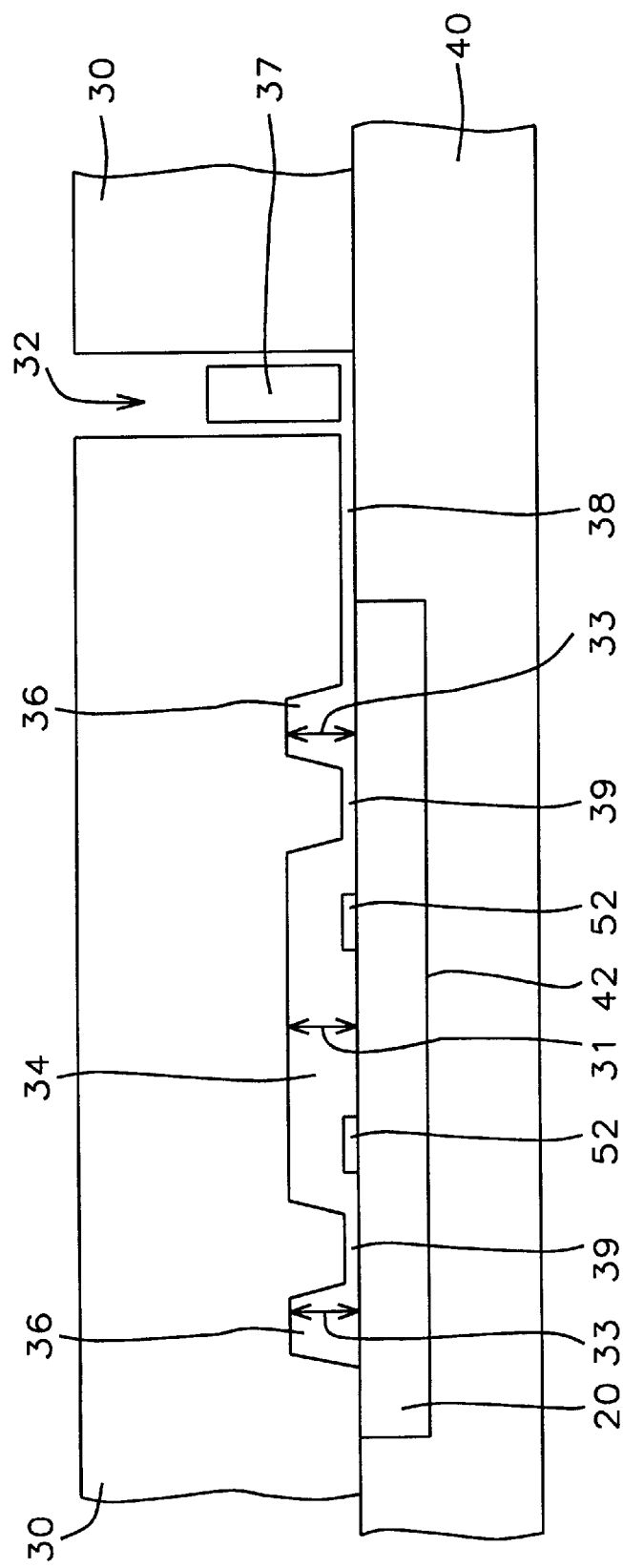
FIG. 6B shows a schematic cross section view, taken along line 6B–6B' of FIG. 6A, of the mold used to form the circuit package of this invention.

Refer now to FIGS. 6A and 6B for the preferred embodiment of a method of forming the molded caps and molded tape supports of this invention. FIG. 6A shows a top view and FIG. 6B a cross section view, taken along line 6B–6B' of FIG. 6A, of a mold, having an upper mold section 30 and a lower mold section 40, used for forming the molded caps and molded tape supports. The upper mold section 30 has tape support cavities 36, cap cavities 34, outboard mold runner gate cavities 38, inboard mold runner gate cavities 39, and a reservoir or pot 32 for molding compound 37. The lower mold section 40 has a cavity 42 for holding and positioning the substrate 20 during the molding operation. Key to the invention is that the depth 33 of the tape support cavities 36 is the same as the depth 31 of the cap cavities 34 so that molded tape supports and molded caps having the same height will result. As shown in FIG. 6B the substrate 20 with devices 52 attached is placed in the cavity 42 in the lower mold section 40. The upper mold section 30 is then positioned over the lower mold section 40 and uncured molding compound 37, such as a conventional epoxy based molding compound, is placed in the molding compound reservoir or pot 32. Uncured molding compound is then forced through the outboard mold runner gate cavities 38 and the inboard mold runner gate cavities 39 to transfer uncured molding compound to the tape support cavities 36 and the cap cavities 34. The molding compound is then cured.

After the molding compound has been cured the substrate 20 with molded tape supports 24 and molded caps 22 is removed from the mold, as shown in FIG. 2. The outboard mold runner gates 28 remain attached to some of the molded tape supports 24 and the inboard mold runner gates 29 remain attached to the molded caps 22 and molded tape supports 24. A molding compound cull remain or residue 26 remains attached to the outboard mold runner gates 28.

Refer again to FIGS. 4 and 5 for the preferred embodiment of handling the circuit package after the molded tape supports 24 and the molded caps 22 have been formed. As shown in FIGS. 4 and 5, after the outboard mold runner gates and molding compound cull remain or residue have been removed stabilizing tape 50 is attached to the tops of the molded tape supports 24 and molded caps 22. The tape 50 is formed of materials such as a polyolefin backing and acrylic based adhesive and is attached using automatic or semi-automatic means. The assembly of the substrate 20, molded tape supports 24, and molded caps 22 then has sufficient rigidity to permit continued processing without damage to the assembly or the devices 52 attached to the substrate 20. The continued processing will include operations such as dicing or cutting the assembly into units, such as units of one or two molded caps, attachment to a higher level assembly, or the like.

While the invention has been particularly shown and described with reference to the preferred embodiments thereof, it will be understood by those skilled in the art that various changes in form and details may be made without departing from the spirit and scope of the invention.

What is claimed is:

1. A molded package, comprising:

a substrate having a first surface and a second surface;

one or more devices attached to said first surface of said substrate;

one or more molded caps, each of said molded caps having a first number of sides and a top, attached to said first surface of said substrate, wherein the top of each of said molded caps is a first distance above said first surface of said substrate and each of said molded caps covers one or more of said devices; and a second number of molded tape supports, each of said molded tape supports having a top, attached to said first surface of said substrate, wherein there are two of said molded tape supports for each of said molded caps located adjacent to opposite said sides of said molded caps, and said top of each of said molded tape supports is said first height above said first surface of said substrate.

2. The molded package of claim 1 further comprising a stabilizing tape attached to said tops of each of said molded caps and to said tops of each of said molded tape supports.

3. The molded package of claim 1 wherein said molded caps and said molded tape supports are formed of epoxy based molding compound.

4. The molded package of claim 1 wherein said first number is four.

5. The molded package of claim 1 wherein said devices comprise integrated circuit elements.

6. The molded package of claim 1 wherein there are twice as many of said molded tape supports as there are of said molded caps.

7. A method of forming a molded package, comprising the steps of:

providing a substrate having a first surface, a second surface, and one or more devices attached to said first surface of said substrate;

providing an upper mold section, wherein said upper mold section has one or more cavities for molded caps, one or more cavities for molded tape supports, one or more mold runner cavities, and one or more cavities for an uncured molding compound;

providing a lower mold section, wherein said lower mold section has a substrate cavity for holding and positioning said substrate;

placing said substrate into said substrate cavity in said lower mold section;

forcing uncured molding compound into said cavities for molded caps and said cavities for tape supports;

curing said molding compound, thereby forming one or more molded caps and one or more molded tape supports on said first surface of said substrate, wherein each of said molded caps has a first number of sides and a top, said top of each of said molded caps is a first distance above said first surface of said substrate, each of said molded caps covers one or more of said devices, each of said molded tape supports has a top, there are two of said molded tape supports for each of said molded caps located adjacent to opposite sides of said molded caps, and said top of each of said molded tape supports is said first height above said first surface of said substrate; and removing said upper mold section and said lower mold section from said substrate, said molded caps and said molded tape supports.

8. The method of claim 7 further comprising attaching a stabilizing tape to said tops of each of said molded caps and to said tops of each of said molded tape supports.

9. The method of claim 7 wherein said molded caps and said molded tape supports are formed of epoxy based molding compound.

10. The method of claim 7 wherein said first number is four.

11. The method of claim 7 wherein said devices comprise integrated circuit elements.

12. The method of claim 7 wherein there are twice as many of said molded tape supports as there are of said molded caps.

13. A method of supporting a molded package during processing, comprising:

providing a substrate having a first surface, a second surface, and one or more devices attached to said first surface of said substrate;

forming one or more molded caps, each of said molded caps having a first number of sides and a top, on said first surface of said substrate, wherein the top of each of said molded caps is a first distance above said first surface of said substrate and each of said molded caps covers one or more of said devices;

forming a second number of molded tape supports, each of said molded tape supports having a top, on said first surface of said substrate, wherein there are two of said molded tape supports for each of said molded caps located adjacent to opposite said sides of said molded caps, and said top of each of said molded tape supports is said first height above said first surface of said substrate, attaching a stabilizing tape to said tops of each of said molded caps and to said tops of each of said molded tape supports thereby forming a molded package assembly; and processing said molded package assembly.

14. The method of claim 13 wherein said processing said molded package assembly comprises dicing said substrate into segments wherein each of said segments has one of said molded caps and two of said tape supports.

15. The method of claim 13 wherein said molded caps and said molded tape supports are formed of epoxy based molding compound.

16. The method of claim 13 wherein said first number is four.

17. The method of claim 13 wherein said devices comprise integrated circuit elements.

18. The method of claim 13 wherein there are twice as many of said molded tape supports as there are of said molded caps.

* * * * *